US012604591B2

(12) United States Patent
Pinos et al.

(10) Patent No.: US 12,604,591 B2
(45) Date of Patent: Apr. 14, 2026

(54) SPACER LED ARCHITECTURE FOR HIGH EFFICIENCY MICRO LED DISPLAYS

(71) Applicant: PLESSEY SEMICONDUCTORS LTD, Plymouth (GB)

(72) Inventors: Andrea Pinos, Plymouth (GB); WeiSin Tan, Plymouth (GB); Samir Mezouari, Plymouth (GB); John Lyle Whiteman, Plymouth (GB)

(73) Assignee: Plessey Semiconductors Ltd, Plymouth Devon (GB)

( * ) Notice: Subject to any disclaimer, the term of this patent is extended or adjusted under 35 U.S.C. 154(b) by 307 days.

(21) Appl. No.: 17/921,021

(22) PCT Filed: May 26, 2021

(86) PCT No.: PCT/GB2021/051329
§ 371 (c)(1),
(2) Date: Oct. 24, 2022

(87) PCT Pub. No.: WO2021/245387
PCT Pub. Date: Dec. 9, 2021

(65) Prior Publication Data
US 2023/0125929 A1 Apr. 27, 2023

(30) Foreign Application Priority Data
Jun. 3, 2020 (GB) ...................................... 2008333

(51) Int. Cl.
*H10H 29/14* (2025.01)
(52) U.S. Cl.
CPC .................................. *H10H 29/142* (2025.01)
(58) Field of Classification Search
CPC ...................................................... H01L 27/156
See application file for complete search history.

(56) References Cited

U.S. PATENT DOCUMENTS

| | | | |
|---|---|---|---|
| 9,000,466 | B1 | 4/2015 | Aldaz et al. |
| 9,680,077 | B1 | 6/2017 | Chen et al. |

(Continued)

FOREIGN PATENT DOCUMENTS

| | | |
|---|---|---|
| CN | 102222740 A | 10/2011 |
| CN | 102856456 A | 1/2013 |

(Continued)

OTHER PUBLICATIONS

Communication pursuant to Article 94(3) EPC in European application No. 21734451.4, mailed Oct. 11, 2024.

(Continued)

*Primary Examiner* — Norman D Richards
*Assistant Examiner* — Sean Ayers Winters
(74) *Attorney, Agent, or Firm* — Cognition IP, P.C.; Edward Steakley

(57) ABSTRACT

A method of forming an optical device, the method comprising the steps of forming a mesa, the mesa comprising an active layer configured to emit light from a first light emitting surface of the mesa when subjected to an electrical current, the mesa further comprising a second surface opposite the light emitting surface and substantially vertical sidewalls, forming spacers on the mesa sidewalls, the spacers being formed from a first electrically insulating, optically transparent material, and having an internal face facing the mesa sidewalls, and an opposing external face, depositing a first layer of transparent conducting oxide on the light emitting surface of the mesa, the transparent conducting oxide having an internal face facing the second surface of the mesa, and an opposing external face, and depositing a layer of reflective, electrically conducting material over the transparent conducting oxide and external faces of the spacers.

10 Claims, 16 Drawing Sheets

(56)                References Cited

U.S. PATENT DOCUMENTS

| | | | |
|---|---|---|---|
| 10,259,696 B2 | 4/2019 | Godet et al. | |
| 2003/0015721 A1* | 1/2003 | Slater, Jr. | H01L 33/20 |
| | | | 257/676 |
| 2007/0116932 A1* | 5/2007 | Van Der Tempel | G02F 1/133305 |
| | | | 428/167 |
| 2008/0043793 A1* | 2/2008 | Ueki | H01S 5/18311 |
| | | | 372/38.05 |
| 2010/0078670 A1 | 4/2010 | Kim et al. | |
| 2012/0224255 A1* | 9/2012 | Bora | H01S 5/1046 |
| | | | 216/13 |
| 2013/0234149 A1* | 9/2013 | Halderman | H01L 33/32 |
| | | | 257/E33.056 |
| 2015/0008392 A1 | 1/2015 | Bonar et al. | |
| 2015/0060924 A1* | 3/2015 | Lin | H01L 33/42 |
| | | | 257/98 |
| 2015/0091037 A1 | 4/2015 | Jung et al. | |
| 2017/0062654 A1* | 3/2017 | Bonar | H01L 33/06 |
| 2017/0098746 A1* | 4/2017 | Bergmann | H01L 33/22 |
| 2017/0271557 A1* | 9/2017 | Brennan | H01L 33/20 |
| 2018/0012770 A1* | 1/2018 | Macelwee | H01L 21/78 |
| 2018/0047865 A1* | 2/2018 | Lin | H10H 20/819 |
| 2018/0083156 A1 | 3/2018 | Mezouari et al. | |
| 2019/0086741 A1* | 3/2019 | Milton | G02F 1/134309 |
| 2020/0075809 A1* | 3/2020 | Rajan | H01L 33/16 |
| 2020/0124248 A1 | 4/2020 | Kim | |
| 2020/0243598 A1* | 7/2020 | Chiu | H10H 20/819 |
| 2021/0288223 A1* | 9/2021 | Young | H01L 33/46 |

FOREIGN PATENT DOCUMENTS

| | | |
|---|---|---|
| JP | 2007335731 A | 12/2007 |
| JP | 2009267418 A | 11/2009 |
| JP | 2011257487 A | 12/2011 |
| JP | 2015028984 A | 7/2013 |
| KR | 100973259 A1 | 8/2010 |
| TW | 202006968 A | 2/2020 |
| WO | 2010074288 A1 | 7/2010 |
| WO | 2016002359 A1 | 1/2016 |
| WO | 20180204402 A1 | 11/2018 |

OTHER PUBLICATIONS

International Preliminary Report on Patentability in PCT International Application No. PCT/GB2021/051329 mailed Dec. 15, 2022.
Second Examination Report in GB Application No. 2008333.3 dated Oct. 18, 2022.
International Search Report and Written Opinion in PCT International Application No. PCT/GB2021/051329 mailed Sep. 16, 2021.
Patents Act 1977: Examination Report under Section 18(3) in GB application No. GB2008333.3, mailed Mar. 1, 2023.
Office Action received in counterpart Chinese application No. 202180037919.6, mailed on Aug. 27, 2025.

* cited by examiner (a)

(b)

(b)

(a)

(b)

(a)

(a)

(b)

(b)

(a)

SPACER LED ARCHITECTURE FOR HIGH EFFICIENCY MICRO LED DISPLAYS

CROSS-REFERENCE TO RELATED APPLICATIONS

This application is a 35 U.S.C. § 371 national stage application of PCT International Application No. PCT/GB2021/051329, filed May 26, 2021, which claims the benefit of Great Britain Application No. 2008333.3, filed Jun. 3, 2020, which are hereby incorporated by reference in their entirety.

FIELD OF THE INVENTION

The invention relates to arrays of light emitting devices and methods of forming arrays of light emitting devices. In particular, but not exclusively, the invention relates to light emitting devices with optimised light extraction.

BACKGROUND OF THE INVENTION

It is known that light emitting diode (LED) devices provide efficient sources of light for a wide range of applications. Increases in LED light generation efficiency and extraction, along with the production of smaller LEDs (with smaller light emitting surface areas) and the integration of different wavelength LED emitters into arrays, has resulted in the provision of high quality colour arrays with multiple applications, in particular in display technologies.

Several display technologies are being considered and used for Micro LED Displays for use in various applications, including Augmented Reality, Merged Reality, Virtual Reality and Direct view displays, such as Smart Watches and Mobile devices. Technologies such as Digital Micro Mirrors (DMD) and Liquid Crystal on Silicon (LCoS) are based on reflective technologies, where an external light source is used to produce Red, Green and Blue photons in time sequential mode and the pixels either divert the light away from an optical element (DMD) or absorb light (LCoS) to adjust the brightness of a pixel in order to form an image. Liquid Crystal Displays (LCD) typically use a back light, an LCD panel on an addressable back plane and colour filters to produce an image. A back plane is required to turn individual pixels on and off and to adjust the brightness of individual pixels for each frame of video. Increasingly, emissive display technologies such as Organic Light Emitting Diode (OLED) or Active Matrix OLED (AMOLED) and more recently, Micro LED as they offer lower power consumption for untethered micro display applications and higher image contrast. Micro LED, in particular, offers higher efficiency and better reliability than micro OLED and AMOLED displays.

The invention being described in this document relates to a method for making a highly efficiency micro LED array combining techniques to improve Internal Quantum Efficiency (IQE) and Light Extraction Efficiency (LEE) to improve efficiency and brightness figures of merit.

Structures deigned to increase light extraction efficiency are well known in the LED industry, including the use of a pseudo parabolic shaped MESA, to direct photons, generated in the multiple quantum wells (MQW), to an emitting surface.

The technique used to fabricate a MESA with such a shape involves a technique such as Reactive Ion Etch (RIE) or Inductively Coupled Etch (ICP). In such etch techniques, a high energy plasma comprising RF, high voltage (DC bias)

and reactive gases, often including free radicals, is used to selectively etch the semiconducting material. The features are defined using a photolithographic process using a photo sensitive material to define areas which will be subject to the etch process and area which will remain un-etched. The precise shape of the MESA can be controlled by the profile of the photo sensitive material used to define the pattern and by etch pressure, power, gas flow and gas species.

Not only does this complicate the manufacturing process, but as a result of this etch process, the edge of the MESA can become damaged which affects the IQE of the micro LED.

As shown in FIG. 1, as DC bias and Plasma density increases, more damage is done to the edge of the feature leading to surface leakage path formed by crystal damage, nitrogen vacancies and dangling bonds. Dry etching generates many crystal defects due to the high energy ion bombardment at the surface. Dangling bonds are easily oxidized and crystal damage generates many defect levels in the energy bands which act as carrier recombination centers at the surface, leading to non-radiative recombination.

The surface recombination velocity (non-radiative recombination velocity) is faster than the radiative recombination velocity in the bulk MQW, therefore the small micro LED is vulnerable to surface recombination and a consequential reduction in IQE.

A widely reported consequence of the damage caused during MESA etch is efficiency reduction with smaller micro LED dimensions, as shown in FIG. 2. External Quantum Efficiency (EQE) is the product of IQE (the ratio of the number of photons generated to the number of electrons. The mechanism that drives this trend is the ratio of the perimeter of the micro LED to the area. As the micro LED reduces in size, the area of the sidewall increases in relation to the area of the MQWs so the surface leakage path at the edge of the micro LED causes increases in non-radiative recombination.

Micro LED displays used for augmented reality and Head Mounted Displays will operate at a current density of 1 A/cm2 to 10 A/cm2. This can imply a 20-fold reduction in efficiency of a small LED compared with a large LED.

The efficiency of micro LEDs can be significantly increased by repairing the damage caused by the MESA etch, as shown in FIG. 3. It is typically possible to effect a 10-fold improvement in EQE by executing an optimized damage repair regime. The peak EQE increases after damage repair and the peak EQE occurs at a lower current density so that at the typical operating conditions, a 10-fold increase in efficiency can be obtained. Such a regime, is not compatible however with preserving a MESA shape which is optimized for high LEE, as the repair process removes the semiconductor material which is damaged by the MESA etch, as shown in FIG. 4.

SUMMARY OF THE INVENTION

In order to mitigate for at least some of the above-described problems there is provided a method of forming one or more optical devices in accordance with the appended claims. Further, there is provided an optical device in accordance with the appended claims.

In a first aspect of the invention, there is provided a method of forming an optical device, the method comprising the steps of forming a mesa, the mesa comprising an active layer configured to emit light from a first light emitting surface of the mesa when subjected to an electrical current, the mesa further comprising a second surface opposite the light emitting surface and substantially vertical sidewalls, forming spacers on the mesa sidewalls, the spacers being formed from a first electrically insulating, optically transparent material, and having an internal face facing the mesa sidewalls, and an opposing external face, depositing a first layer of transparent electrically conducting material on the light emitting surface of the mesa, the transparent conducting oxide having an internal facing surface facing the second surface of the mesa, and an opposing external facing surface, and depositing a layer of reflective electrically conducting material over the transparent conducting oxide and external faces of the spacers.

Advantageously, the spacers and transparent electrically conducting material act as an optical component to enhance light extraction from the active layer of the mesa, whilst the reflective, electrically conducting material acts as an outermost mirror layer to further enhance light extraction.

Preferably the external surface of the first layer of transparent electrically conducting material is substantially convex.

Preferably a second layer of transparent electrically conducting material is formed on the light emitting surface of the mesa.

Preferably the transparent electrically conducting material is a transparent conducting oxide. Yet more preferably, the transparent electrically conducting material is indium tin oxide.

Preferably the external faces of the spacers are angled relative to the internal faces.

Preferably the external faces of the spacers have a pseudo-parabolic profile. The parabolic shape works to direct emitted photons towards the light emitting surface of the device such that they are incident on said surface at an angle of incidence below the critical angle, thereby allowing photons to be extracted into air at a high efficiency.

Preferably the external faces of the spacers have a profile that approximates a Bézier curve having two control points with a Bézier coefficient of 0.5. This has been found to provide the maximum light extraction.

Preferably the spacers are formed of silicon nitride, silicon oxide or tin oxide.

Preferably the light emitting structure has roughened sidewalls. This has been found to improve the luminance uniformity and further enhance light extraction.

Preferably the method further comprises the step of depositing a second electrically insulating, optically transparent material on the external face of each of the spacers, the second electrically insulating, optically transparent material having a different refractive index to that of the first electrically insulating, optically transparent material. This allows for the use of materials with graduated indices of refraction, such that the emitted photons can be better directed towards the light emitting surface.

Preferably the refractive index of the first material is greater than that of the second material.

Preferably the active layer of the mesa is between an n-doped n-cladding layer and a p-doped p-cladding layer.

Preferably a first electrical contact is made to the p-cladding layer via the first layer of transparent conducting oxide and the reflective electrically conducting material and a second electrical contact is made to the n-cladding layer via the second layer of transparent conducting oxide.

In a second aspect of the invention there is provided an optical device manufactured according to the method steps given above.

Further aspects of the invention will be apparent from the description and the appended claims.

DETAILED DESCRIPTION OF AN EMBODIMENT OF THE INVENTION

A detailed description of embodiments of the invention is described, by way of example only, with reference to the figures, in which:

FIG. 12 shows an embodiment using two different spacer materials.

FIG. 13 shows and embodiment with roughened MESA sidewalls.

Figure 5:
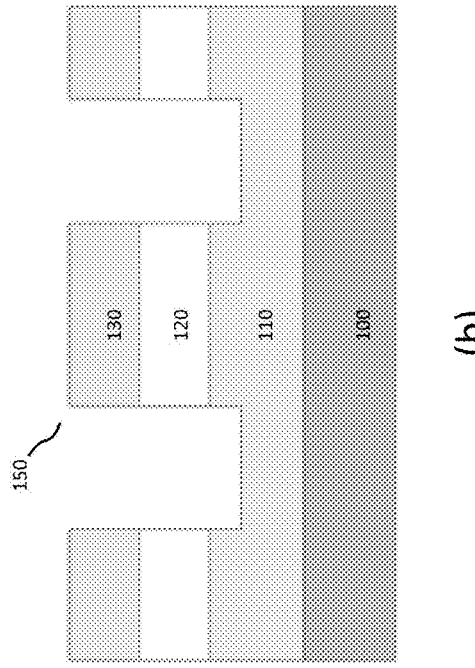
FIGS. 5-10 show the stages of the monolithic manufacturing process for the optical devices.
Figure 5:
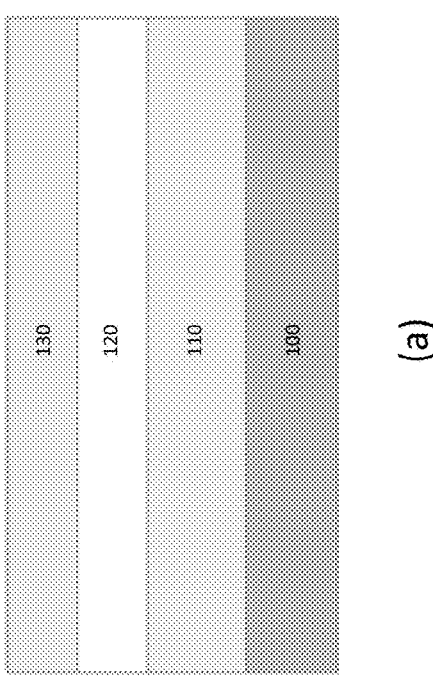

FIG. 5(a) shows a preliminary stage in the manufacturing process wherein an epitaxial silicon wafer is prepared having a substrate 100, an n-cladding layer 110, an active layer 120 and a p-cladding layer 130. In an embodiment the active layer contains one or more quantum wells that emit light when an electrical current is applied across the active layer 120. In an embodiment, the n-cladding layer 110 and p-cladding layer 130 are formed of n-doped and p-doped gallium nitride respectively. In a particular embodiment, an electron blocking layer is situated between the p-cladding layer 130 and the active layer 120. In a further embodiment, one or more buffer layers are included.

Whilst described as being grown on a silicon wafer, the skilled person would appreciate that any suitable substrate could be used. In an embodiment, a sapphire substrate is employed. In a further embodiment, additional or alternative intervening layers are used in order to account for a lattice mismatch between the substrate and the subsequently grown layers, such as an aluminium nitride buffer layer. Equally, alternative or additional etch techniques could be utilised, provided they result in the array of MESAs as described.

At the stage shown in FIG. 5(b), a plurality of openings, one for each sub-pixel, are made in the p-cladding 130, n-cladding 110 and active layers 120 by way of a photo lithography followed by a reactive ion etch (RIE) or inductively coupled plasma (ICP) etch process. This produces an array of MESAs having generally sloped sidewalls with each mesa representing an individual light emitting structure 150. In an embodiment, the etch is tuned to provide pseudo parabolic shaped sidewalls.

Figure 1:
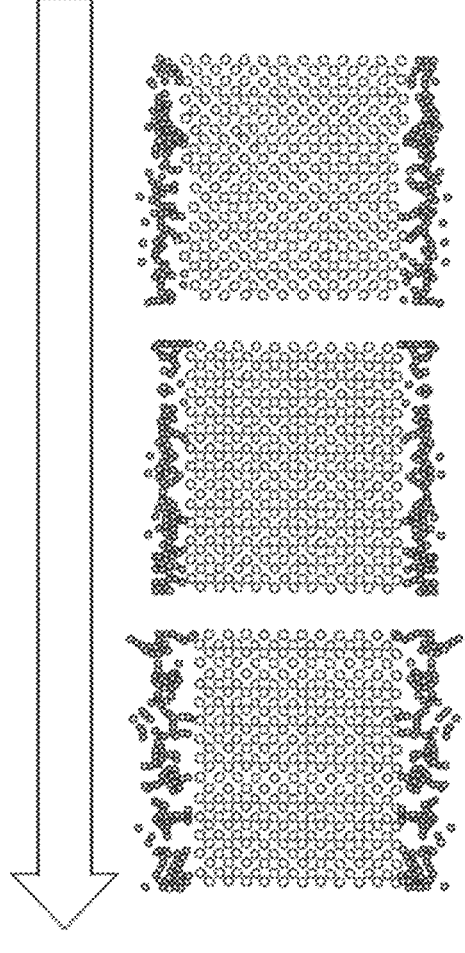
FIG. 1 shows a crystal damage to InGaN material with increasing plasma power and DC bias.
Figure 2:
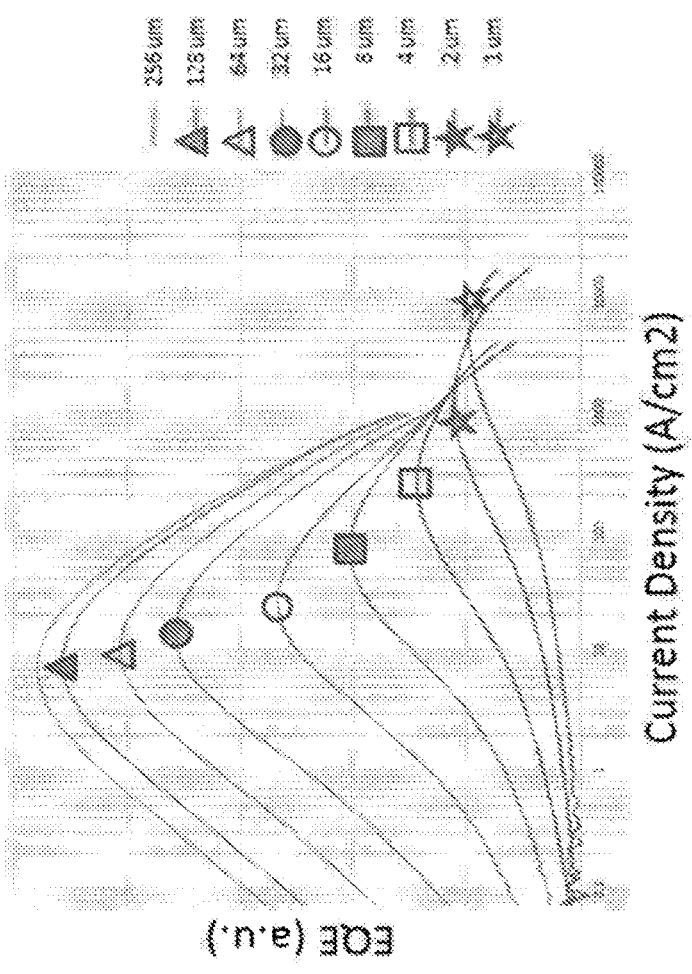
FIG. 2 shows external quantum efficiency (EQE) vs current density for micro LED sizes reducing from A1 (256 μm) to A9 (1 μm).
Figure 3:
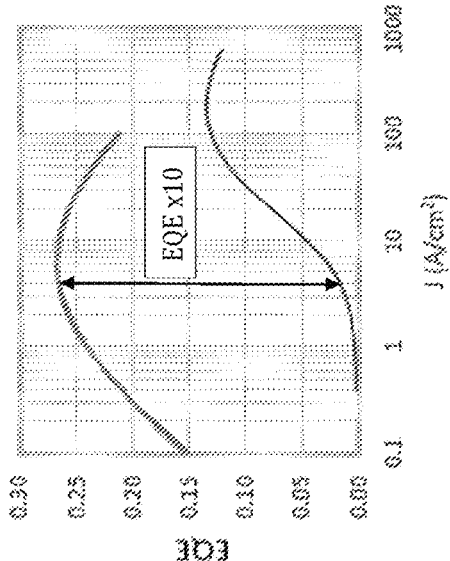
FIG. 3 shows the EQE of a micro LED with and without MESA damage reduction and repair.
Figure 4:
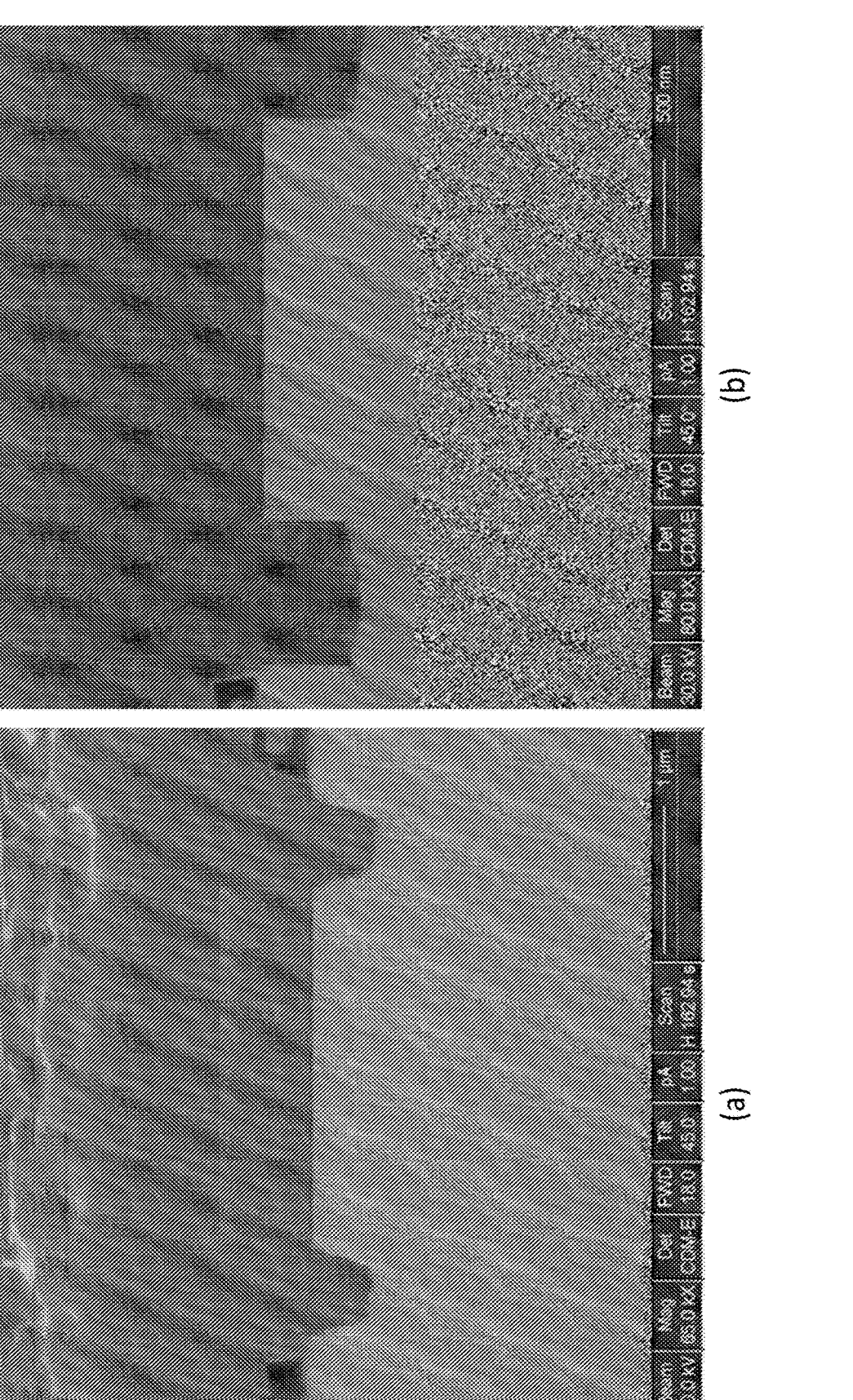
FIG. 4 shows a cross section of an etched MESA, pre (a) and post (b) damage repair process.

As a result of the etch process, the MESA sidewalls contain damaged crystal structures which lead to surface leakage paths. To repair the damaged crystalline structure a repair process is applied which removes the damaged material to reveal good quality crystal structure with reduced dangling bonds and nitrogen vacancies. In an embodiment, this is achieved via a potassium hydroxide wet etch. In an alternative embodiment, the repair process includes consists of a wet etch using tetramethylammonium hydroxide. The opening sidewall profile is thus changed from being sloped or shaped, to being vertical—see FIG. 4.

Optionally, the surface roughness of the sidewalls can be tuned, either by performing a further dry etch, or by using a photolithographic resist with a suitable resist profile. Advantageously, substantially vertical, yet roughened sidewalls have been found to improve the luminance uniformity and enhance light extraction from the optical device.

Figure 6:
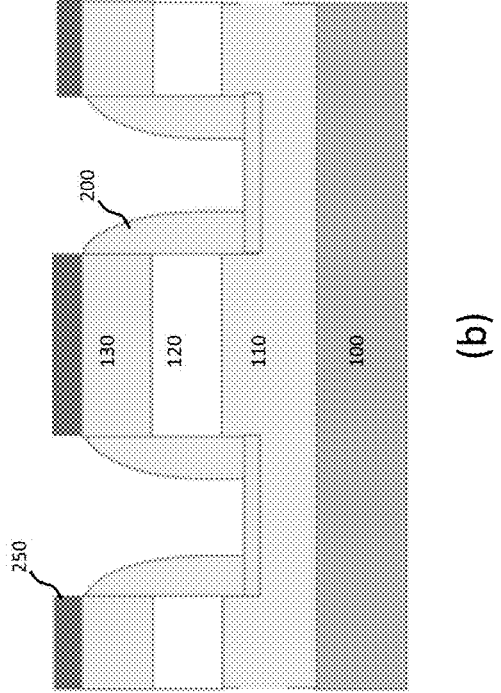
Figure 6:
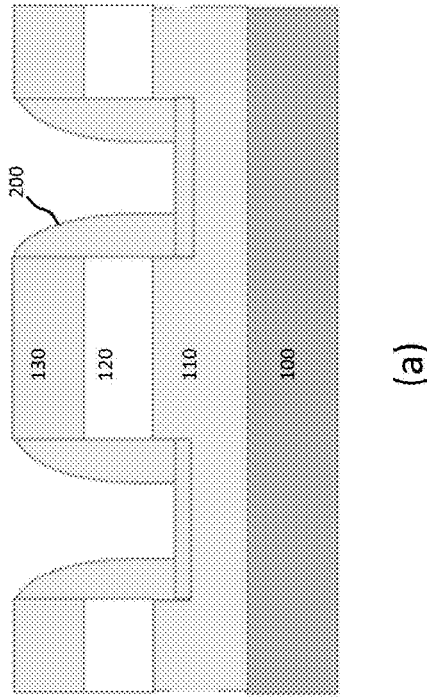

At the stage shown in FIG. 6(*a*), a conformal coating of silicon dioxide is deposited and the resulting film is etched back using RIE etch to form a uniform, pseudo parabolic spacers 200. In alternative embodiments, one of silicon nitride, titanium oxide or any other dielectric material are used as the spacer material. The skilled person would be aware that any suitably high index of refraction, non-conducting material may be used. The purpose of the spacer is to act as an optical component to enhance light extraction from the active layer 120. As can be seen in FIG. 6(*a*), the portions of the n-cladding layer 110 exposed by the etch are also coated with the spacer material.

At the stage shown in FIG. 6(*b*), a first transparent electrically conducting material 250 is deposed on the exposed p-cladding layer of each mesa via a known process, thereby forming individual p-contacts to each light emitting structure 150. In an embodiment, the first transparent electrically conducting material is a transparent conducting oxide 250 such as indium tin oxide (ITO), though the skilled person would understand that any suitably transparent and conducting material could be used.

Figure 7:
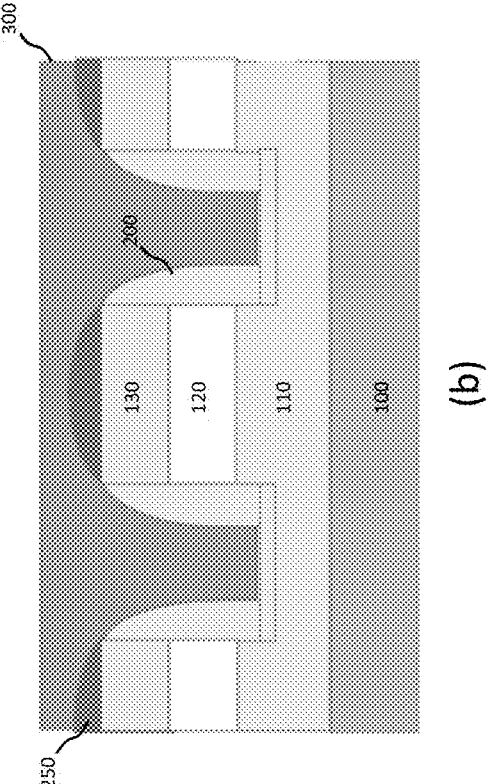
Figure 7:
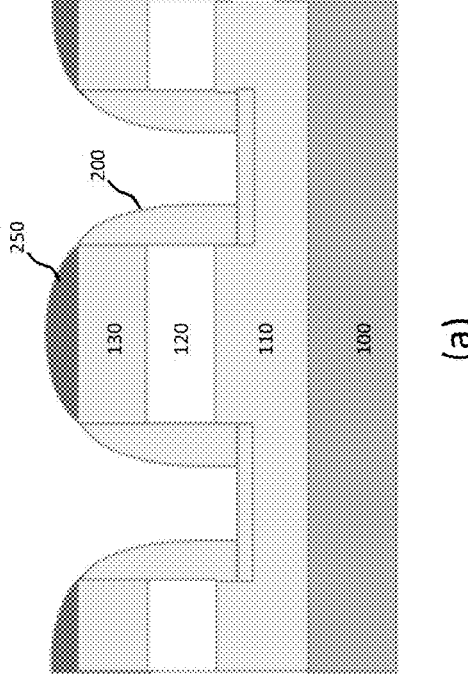

At the stage shown in FIG. 7(*a*), the first transparent conducting oxide 250 is shaped to produce a convex lens on each light emitting structure 150. In an embodiment, this is achieved by patterning a photoresist material onto the surface of the first transparent conducting oxide 250, reflowing the photoresist with either heat or a suitable solvent so as to form the photoresist into hemispherical droplet and applying an etch (such as a reactive ion etch) thereby providing a convex profile to the transparent conducting oxide 250 as a result of the difference in etch selectivity (i.e. etch rate) of the oxide 250 and the photoresist.

At the stage shown in FIG. 7(*b*), a reflective, electrically conducting material 300 is deposited over the entire structure and a chemical-mechanical polishing process is applied to ensure a flat outermost surface. In an embodiment, the reflective, electrically conducting material 300 is aluminum, though the skilled person would be aware that any suitable material could be used. In an embodiment, the interface between the spacers 200 and the reflective, electrically conducting material 300 has a surface roughness of Ra<50 nm and most preferably, Ra<10 nm so as to prevent diffusion of light which would otherwise reduce the light extraction efficiency.

Figure 8:
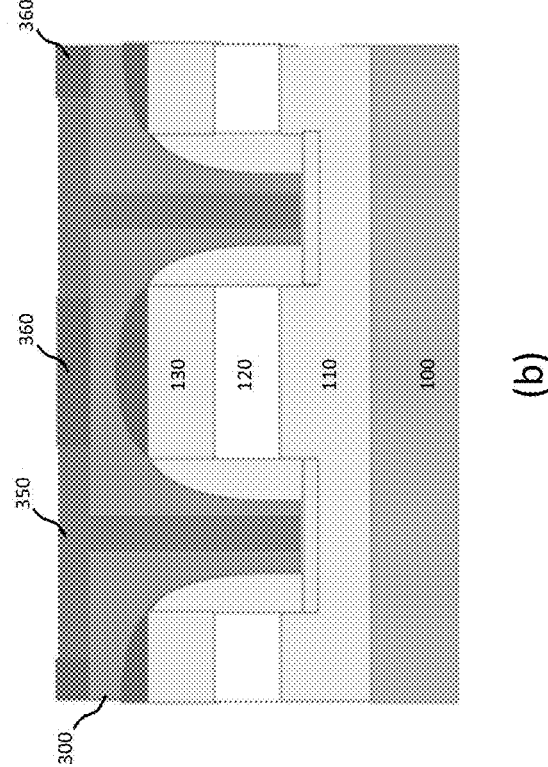
Figure 8:
Figure 8:
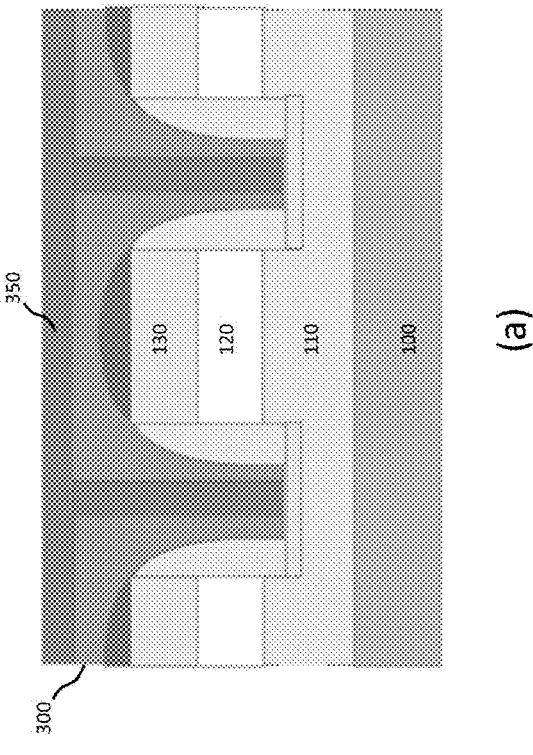

At the stage shown in FIG. 8(*a*), in order to electrically isolate each light emitting structure 150 from its neighbours, a series of channels are etched in the reflective electrically conducting material 300 between each mesa via known means. A layer of silicon dioxide 350 is the applied over the surface of the reflective, electrically conducting material 300, filling the channels. Whilst silicon dioxide is preferred, the skilled person would be aware than any electrically insulating material may be used.

At the stage shown in FIG. 8(*b*), windows are made through the silicon dioxide layer 350 through to the underlying reflective, electrically conducting material 300. The windows are subsequently filled with a bonding metal 360, allowing for an electrical connection to be made through the reflective, electrically conducting material 300 to the first transparent conducting oxide 250 p-contacts.

Figure 9:
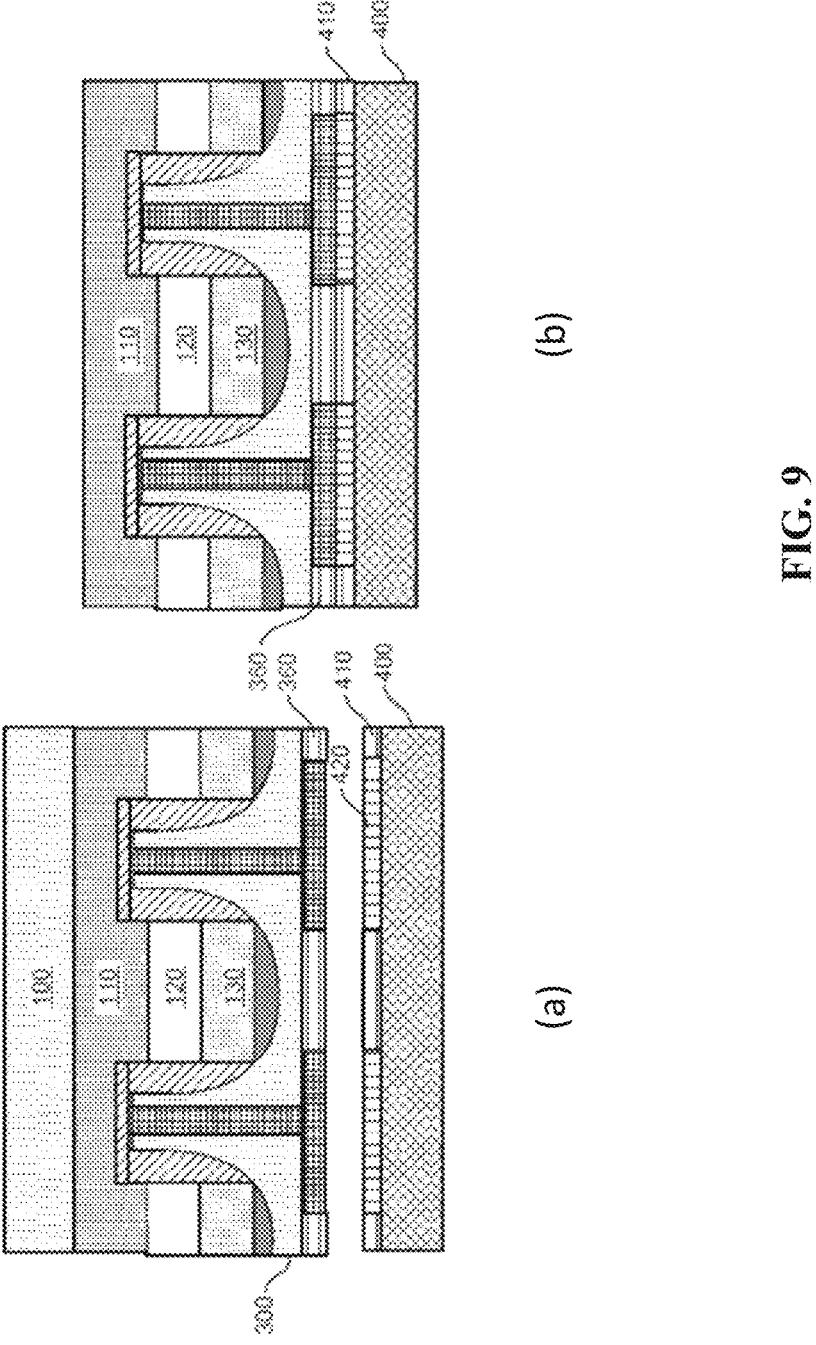

At the stage shown in FIG. 9(*a*), a complementary metal-oxide-semiconductor (CMOS) backplane wafer 400 is prepared having a top layer composed of alternating metal 410 and oxide 420 regions. This structure is formed by known means. The metal regions 410 are aligned with the portions of bonding metal 360 and the wafers are secured together via processes known to the skilled person. The overlying substrate 100 is then removed by known means (such as a wet or dry etch), as shown in FIG. 9(*b*).

Figure 10:
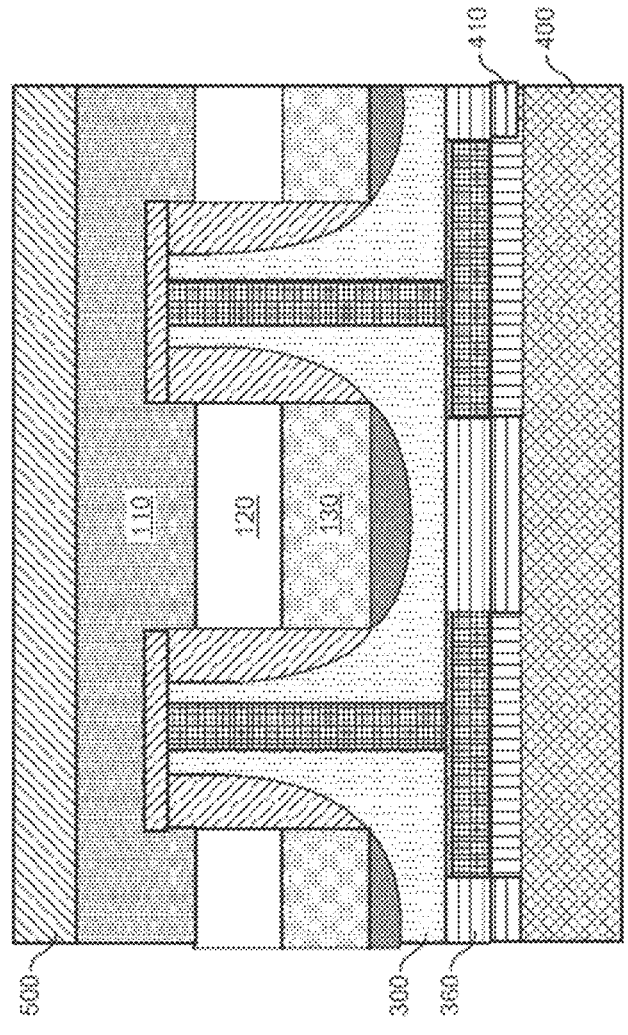

According to FIG. 10, a second layer of transparent conducting oxide 500 is applied to the newly exposed n-cladding layer 110. In an embodiment, indium tin oxide is used as the transparent conducting oxide.

In order to further increase the light extraction efficiency, the refractive index of the transparent conductive oxide 500 may be varied through variation in the porosity of the transparent conductive oxide. One known method for varying the porosity of a transparent conductive oxide, such as ITO, is oblique-angle deposition using electron-beam evaporation. By varying the angle of the deposition surface relative to the vapour flu deposition, the amount of shadow cast by as-deposited material may be controlled, thereby controlling the porosity of the as-formed layer. Further explanation of oblique angle deposition for ITO may be found in at least "Light-Extraction Enhancement of GaInN Light Emitting Diodes by Graded-Refractive-Index Indium Tin Oxide Anti-Reflection Contact", Jong Kyu Kim et. al., Advanced Materials, 0000, 00, 1-5.

Figure 11:
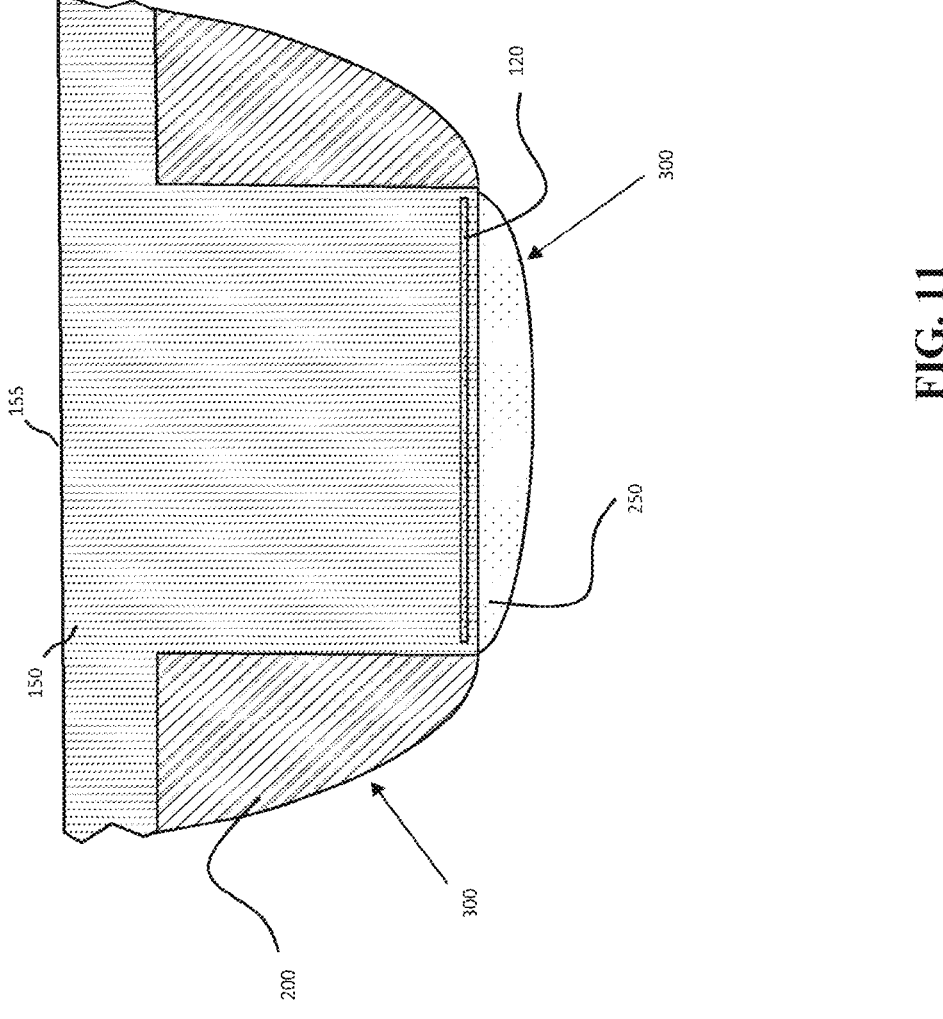
FIGS. 11-13 show an optical device according to an aspect of the present invention.
Figure 13:
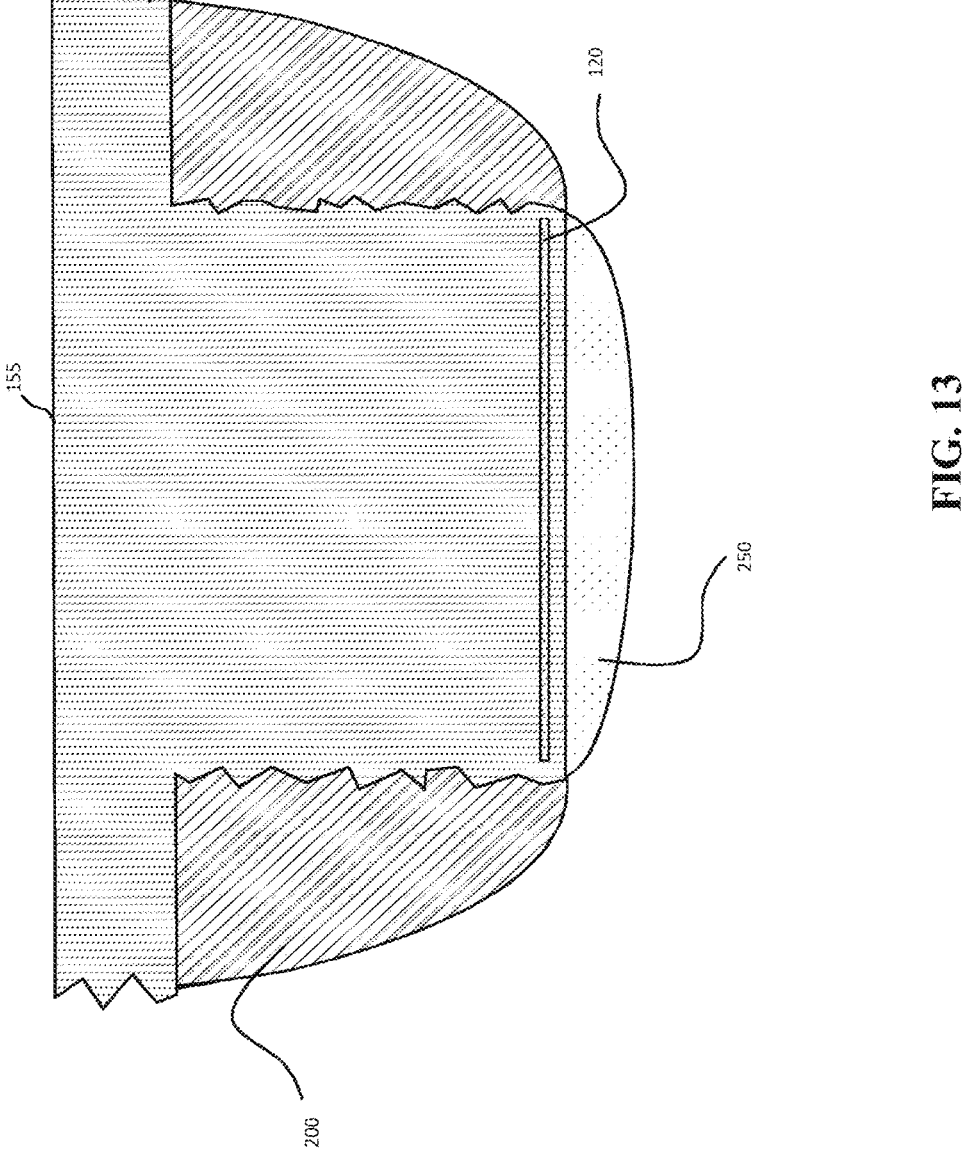

FIG. 11 shows an optical device formed by a single light emitting structure 150 and the surrounding material. As illustrated, the light emitting structure 150 has an active layer 120 configured to emit light when exposed to an electrical current. The active layer 120 is sandwiched between an n-cladding layer 110 such as n-doped gallium nitride and a p-cladding layer 130 such as p-doped gallium nitride. In an embodiment the active layer 120 contains multiple quantum wells. In further embodiments, alternative layer structures are used having alternative and/or additional layers. The skilled person would appreciate that any number of potential light emitting structures can be used providing they operate as described. In a particular embodiment, the light emitting structure includes an electron blocking layer situated between the p-cladding layer 130 and the active layer 120. In a further embodiment, the light emitting structure 150 includes one or more buffer layers. The light emitting structure 150 has a top light emitting surface 155 and substantially vertical sidewalls. FIG. 13 shows an embodiment having roughened sidewalls which have been found to improve luminance uniformity and enhance light extraction especially when there is a significant different in the refractive index of the spacer material and the material of the light emitting structure 150. As is illustrated, a p-contact is provided in contact with the p-cladding layer 130 in the form of a first transparent conducting oxide 250 in the form of a convex lens. The first transparent conducting oxide 250 thus forms a first electrical contact to the light emitting structure 150, with a second common electoral contact being made to the n-contact layers of each light emitting structure 150 via the second transparent conducting oxide layer 500.

In contact with sidewalls of the light emitting structure are respective pseudo parabolic spacers 200 formed of silicon dioxide and having index of refraction $n_1$. In an alternative embodiment, the spacers are formed from silicon nitride or titanium oxide. Whilst the spacers have a pseudo parabolic profile in the illustrated embodiment, the sides can have any suitable profile described by a range of Bézier curves having two control points and coefficients B—where B is one of 0.1, 0.5, 0.2 and 0.05. In a preferred embodiment, the Bézier coefficient is 0.5, resulting in approximately straight sided spacers angled outward away from the mesa sidewalls.

Figure 12:
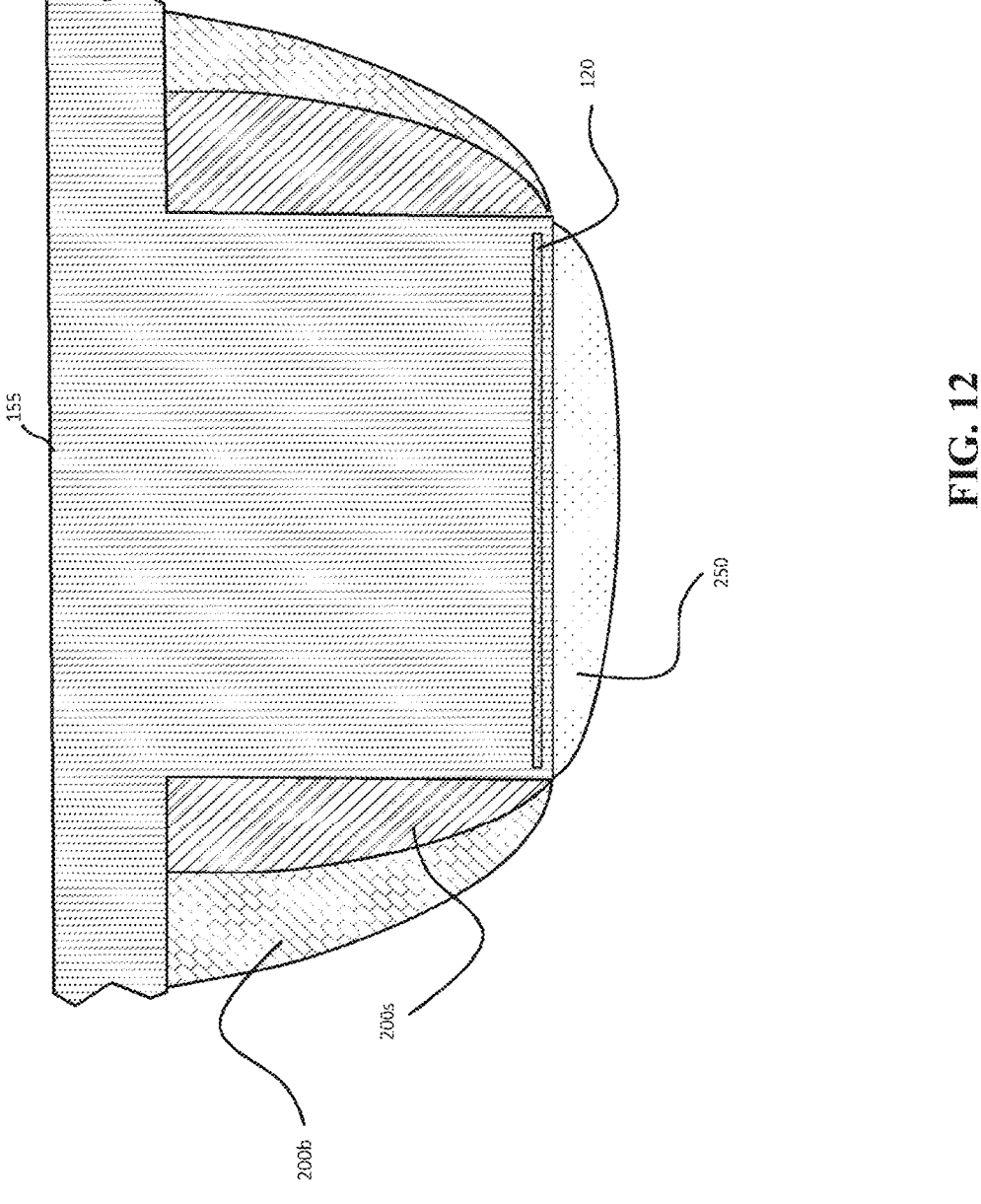
Figures 16A, 16B, 16C, 16D:
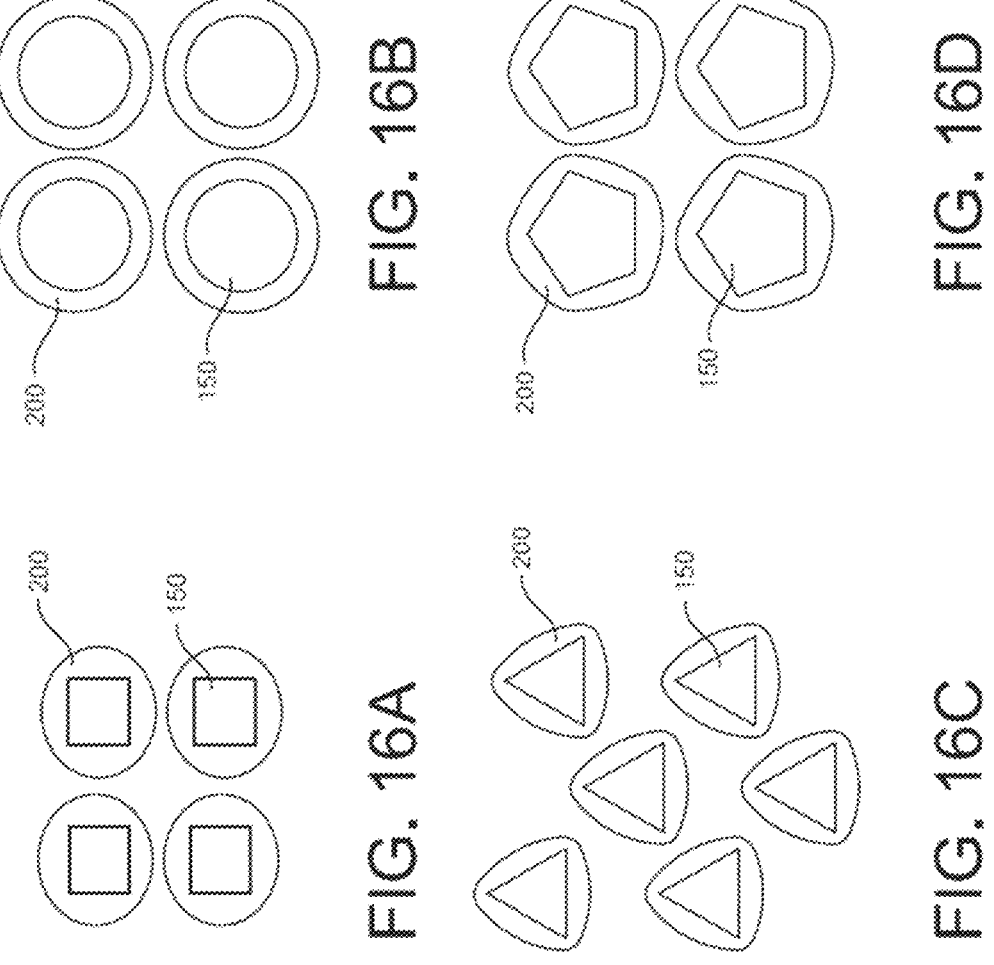
FIG. 16 shows embodiments wherein the optical device has a square (a), circular (b), triangular (c) and pentagonal (d) cross-section.

FIG. 12 depicts an embodiment in which the spacers 200 are formed of an inner portion 200a and an outer portion 200b having refractive indices $n_1$ and $n_2$ respectively. In a preferred embodiment, $n_1 > n_2$ which can be achieved by using silicon nitride as the inner spacer material and aluminium oxide as the second spacer material. In a further embodiment, additional spacer layers can used with a decreasing index of refraction away from the sidewalls of the light emitting structure 150 (i.e. $n_1 > n_2 > n_N$). Whilst depicted as two separate spacers in schematic FIG. 12, the spacers can in fact be formed as a continuous layer, as shown in the cross-sectional views depicted in FIG. 16, with the light emitting structure 150 having any preferred cross-section depending on their application.

Whilst not shown, the reflective, electrically conducting material 300 coats the outer face of the spacers 200 and the transparent conducting oxide 250 thereby forming an electrical contact to the n-cladding layer 110.

Again whilst not shown, the light emitting surface 155 of the light emitting structure 150 is covered by second layer of transparent conducting oxide 500. In an embodiment, a light extraction feature is provided in the form of a convex lens above each underlying light emitting structure 150. In a particular embodiment, the light extraction features are patterned in the transparent conducting oxide itself. In an alternative embodiment, it is provided by a separate layer formed of a suitable transparent material, such as resin.

In use, a current is applied to the light emitting structure via the common electrode formed by the second transparent conducting oxide 500 and the p-contact provided by the first transparent conducting oxide 250, with the reflective, electrically conducting material 300 further operating as a current spreading layer. Light emitted by the active layer 120 is directed towards the light emitting surface 155 either directly or i) via reflections and/or refractions at the spacers 200, ii) via reflections at the interface of the reflective, electrically conducting material 300 covering the spacers 200 and first transparent conducting oxide 250 (itself acting as a convex lens), or iv) via multiple reflections within the structure including combinations of the above. Accordingly, the spacers 200, first transparent conducting oxide 250 and the reflective, electrically conducting material 300 are arranged to increase the proportion of light incident on the light emitting surface 155 within the critical angular range to allow for transmission of light.

A study is conducted based on optical simulations of the light extraction and coupling efficiency as a function of the radius of curvature of the convex lens provided by the first transparent conductive oxide 250 and the depth of the MESA.

Figure 14:
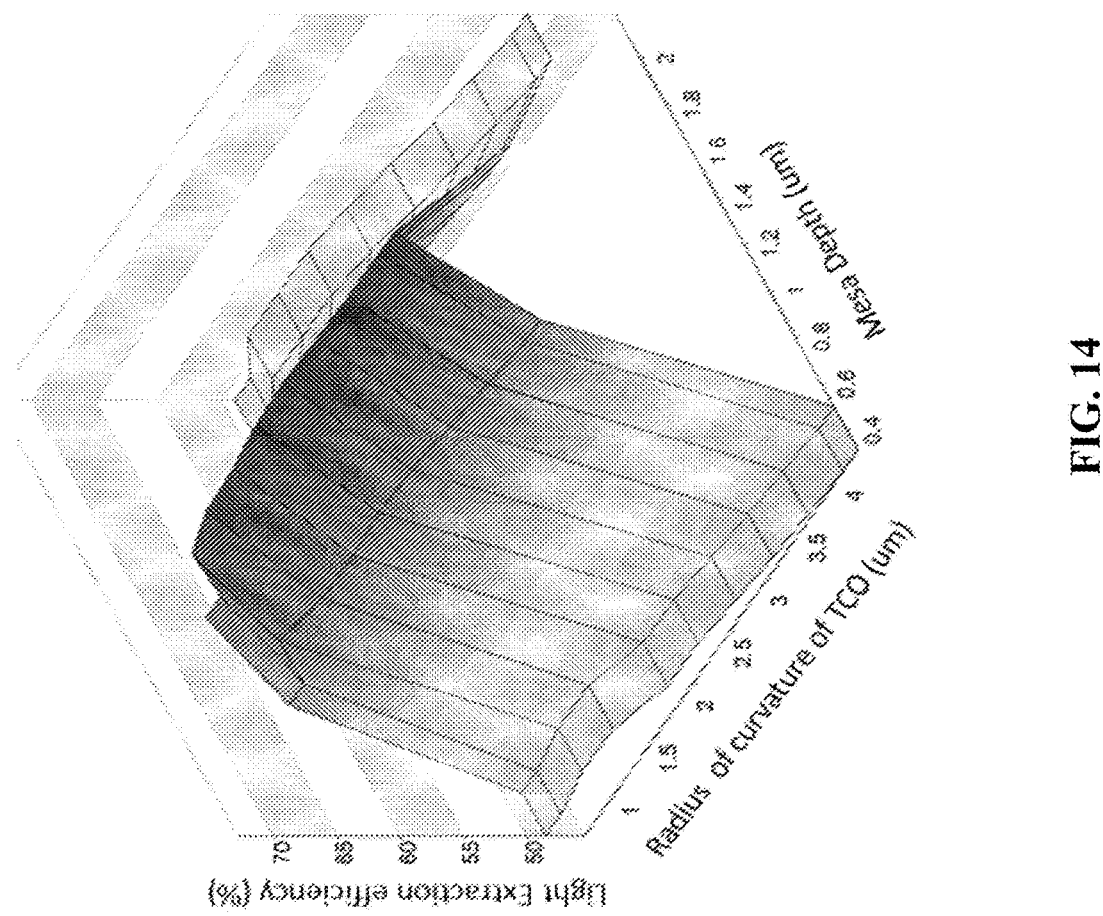
FIG. 14 shows the variation of light extraction efficiency (LEE) with radius of curvature R and Bézier coefficient B.

The light extraction efficiency versus both the radius of curvature of the convex lens provided by the first transparent conductive oxide 250 and the depth of the MESA is shown in FIG. 14, assuming a 3 micron pitch LED for the light emitting structure 150, with silicon nitride spacers and indium tin oxide as the first transparent conducting material

250. Silicon nitride is used in particular because of its high index of refraction (2.05 at 450 nm wavelength) and its commonality in the semiconductor industry.

FIG. 14 shows that optimum light extraction is achieved when the MESA depth is between 1 micron and 1.3 microns and the radius of curvature of the convex lens provided by the first transparent conductive oxide 250 is greater than 1.5 microns.

As such, the present micro-LED array device is particularly suitable for virtual and augmented reality systems where it is coupled to a projection lens system to form a virtual image perceived by the eye. Typically, the projection has an F-number between 1.5 and 4. In this disclosure we have taken a projection lens of F-number 2 (F/2) and performed ray-tracing simulations. An F/2 projection lens has an acceptance angle of about +/−14 degree, so light emitted outside this angular range is not coupled to the imaging optical path and therefore becomes undesirable stray-light within the system.

Figure 15:
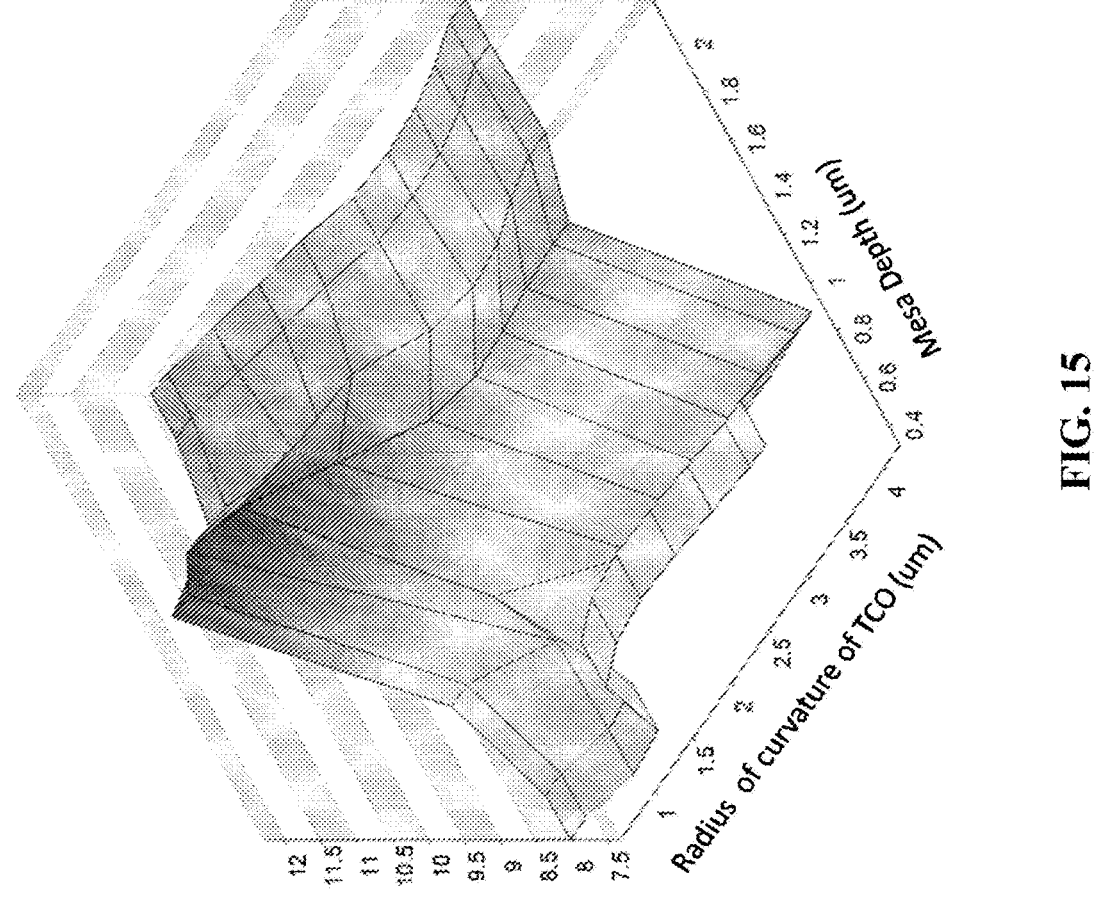
FIG. 15 shows the variation of coupling efficiency of F/2 projection lens with radius of curvature R and Bézier coefficient B.

FIG. 15 shows the coupling efficiency of such system (F/2) where the maximum coupling efficiency is achieved for MESA depth at about 1.2 microns and a radius of curvature of the convex lens provided by the first transparent conductive oxide 250 of 1.1 microns, with an LED pitch (i.e. spacing between neighbouring light emitting structures 150) of 3 microns.

The invention claimed is:

1. A method of forming an optical device, the method comprising the steps of:
  forming a mesa, the mesa comprising an active layer configured to emit light from a first light emitting surface of the mesa when subjected to an electrical current, the mesa further comprising a second surface opposite the first light emitting surface and substantially vertical sidewalls, wherein the sidewalls of the mesa are roughened;
  forming spacers on the mesa sidewalls, the spacers being formed from a first electrically insulating optically transparent material, and having an internal face facing the mesa sidewalls, and an opposing external face, wherein the external faces of the spacers are straight sided and angled outward away from the mesa sidewalls;
  depositing a first layer of transparent electrically conducting material on the second light emitting surface of the mesa, the transparent electrically conducting material having an internal face facing the second surface of the mesa, and an opposing external face, wherein the external face of the first layer of transparent, electrically conducting material is substantially convex, and the external face of the first layer of transparent, electrically conducting material has a radius of curvature of between 1 and 1.5 microns;
  forming a second layer of transparent, electrically conducting material on the first light emitting surface of the mesa; and
  depositing a layer of reflective electrically conducting material over the transparent electrically conducting material and external faces of the spacers.

2. The method of claim 1 wherein the transparent, electrically conducting material is a transparent conducting oxide.

3. The method of claim 2 wherein the transparent conducting oxide is indium tin oxide.

4. The method of claim 1 wherein the external faces of the spacers have a profile that approximates a Bézier curve having two control points with a Bézier coefficient of 0.5.

5. The method of claim 1 wherein the spacers are formed of at least one of silicon nitride, silicon oxide or tin oxide.

6. The method of claim 1 further comprising the step of depositing a second electrically insulating, optically transparent material on the external face of each of the spacers, the second electrically insulating, optically transparent material having a different refractive index to that of the first electrically insulating, optically transparent material.

7. The method of claim 1 wherein the refractive index of the first electrically insulating, optically transparent material is greater than that of the second electrically insulating, optically transparent material.

8. The method of claim 1 wherein the active layer of the mesa is between an n-doped n-cladding layer and a p-doped p-cladding layer.

9. The method of claim 8 wherein a first electrical contact is made to the p-cladding layer via the first layer of transparent conducting oxide and the reflective, electrically conducting material and a second electrical contact is made to the n-cladding layer via the second layer of transparent conducting oxide.

10. An array of optical devices manufactured according to the method of claim 1.

\* \* \* \* \*